United States Patent [19]

Win et al.

[11] Patent Number: 5,079,450

[45] Date of Patent: Jan. 7, 1992

[54] SELF-LATCHING LOGIC GATE FOR USE IN PROGRAMMABLE LOGIC ARRAY CIRCUITS

[75] Inventors: Vincent K. Z. Win, Milpitas; Andrew K. Chan, Palo Alto, both of Calif.

[73] Assignee: Advance Micro Devices, Inc., Sunnyvale, Calif.

[21] Appl. No.: 582,013

[22] Filed: Sep. 13, 1990

Related U.S. Application Data

[63] Continuation of Ser. No. 285,496, Dec. 16, 1988, abandoned.

[51] Int. Cl.[5] .................. H03K 19/94; G06F 7/38
[52] U.S. Cl. .................. 307/465; 307/445; 307/451; 307/469; 307/247.1; 307/272.1
[58] Field of Search .............. 307/443, 445, 448, 451, 307/465, 468–469, 247.1, 272.1

[56] References Cited

U.S. PATENT DOCUMENTS 4,124,899 11/1978 Birkrer et al. .................. 307/207
4,717,912 1/1988 Harvey et al. .................. 307/57
4,812,675 3/1989 Goetting .................. 307/465

OTHER PUBLICATIONS

Monolithic Memories PAL20RA10.

Primary Examiner—Stanley D. Miller
Assistant Examiner—Margaret Rose Wambach
Attorney, Agent, or Firm—Benman & Collins

[57] ABSTRACT

A self-latching logic gate is disclosed which includes a first logic gate circuit for generating an output signal representative of a function of two or more input signals. The first logic gate circuit includes a first logic gate having at least two transistors, each transistor having first, second and third terminals. The first terminals of each transistor are connected to provide an output terminal for the self-latching logic gate and the first logic gate circuit. The second terminals of the transistors provide first and second data input terminals for the logic gate circuit. The third terminals of each transistor are connected to a common termination (i.e. ground). First and second complementary mode transistors are provided. Each includes first, second and third terminals, with the first terminal of the first transistor being connected to a source of electrical potential, the second terminals of the first and the second transistors being connected to each other to provide a common input terminal for the first and second transistors, the third terminal of the first transistor and the first terminal of the second transistor being connected to the output terminal of the first logic gate, and the third terminal of the second transistor being connected to ground. A second logic gate circuit is provided for including a second logic gate having first and second input terminals, the first input terminal being connected to the output terminal of the first logic gate circuit, the second input terminal providing a latch input terminal for the self-latching gate, and the output terminal of the second logic gate being connected to the common input terminal of the first and second transistors. In a specific embodiment, the present invention provides a NOR gate with a self-latching output, with minimal parts count and power consumption, which is suitable for use in a PAL system. In further more specific embodiments, the invention includes circuitry for verifying the state of the PAL array, circuitry for changing the polarity of the array output and circuitry for providing system security all with minimal parts counts and power consumption.

11 Claims, 3 Drawing Sheets

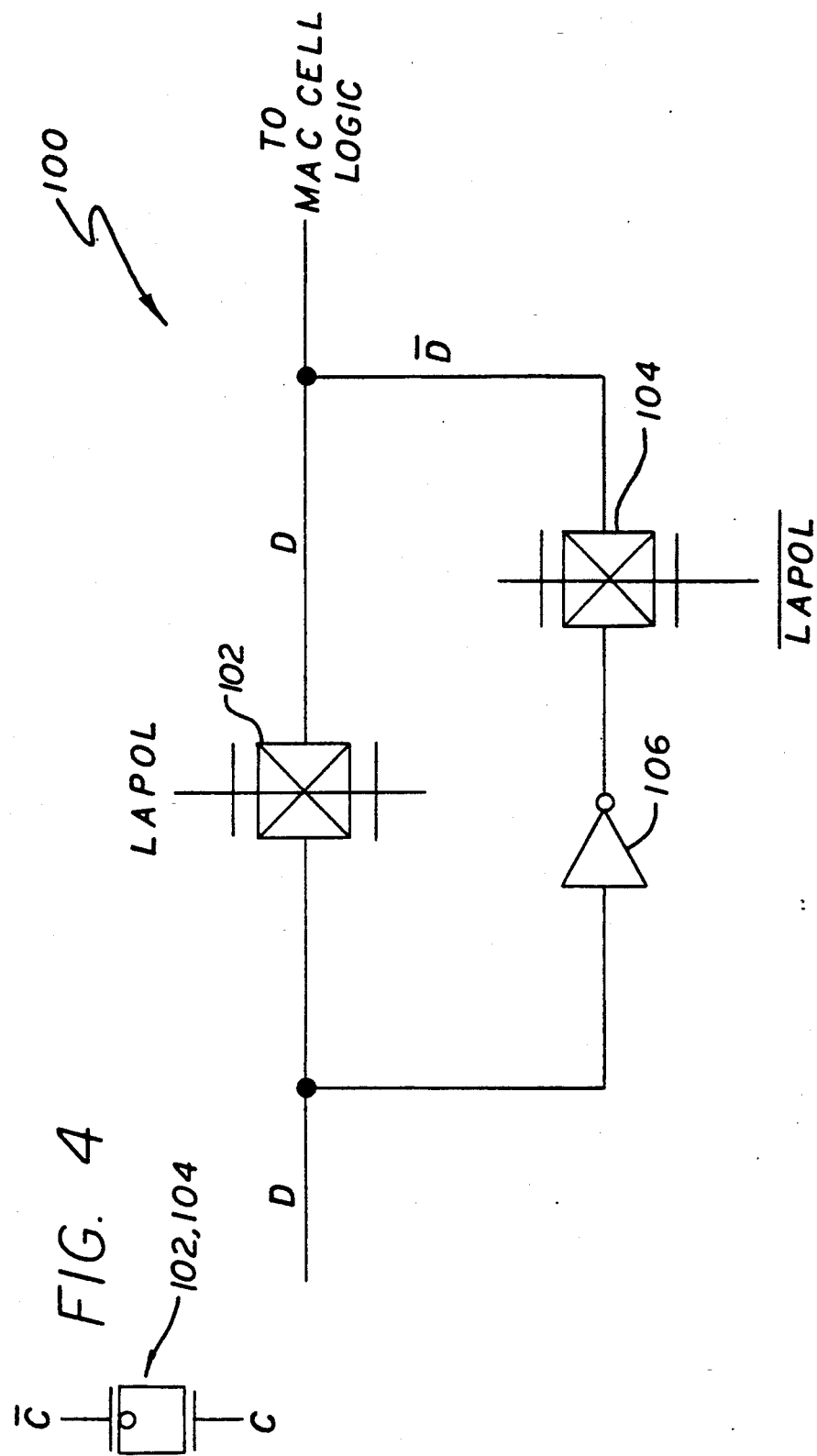

SELF-LATCHING LOGIC GATE FOR USE IN PROGRAMMABLE LOGIC ARRAY CIRCUITS

This is a continuation of application Ser. No. 07/285,496, filed Dec. 16, 1988, now abandoned.

BACKGROUND OF THE INVENTION

1. Field of the Invention

The present invention relates to programmable logic arrays (PLAs). More specifically, the present invention relates to programmable array logic (PAL) circuits.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Programmable logic arrays provide 'glue logic' for PC (printed circuit) boards. Glue logic is the logic required to interface two boards and generally includes a plurality of AND gates, OR gates and input/output I/O buffers. PLAs consume less space and therefore generally provide glue logic in a less costly manner than individual AND gates, OR gates and I/O buffers.

PLAs also offer the advantage of reconfigurability over discrete or individual gates. That is, PLAs generally include an array of 'AND' gates, an array of 'OR' gates, and some provision for interconnecting the outputs of selected AND gates to the inputs of selected OR gates. PLAs allow a wide variety of logic functions to be implemented through the combination, via the OR gates, of the product terms, provided by the AND gates. Further, the configuration of the array may be quickly, easily and relatively inexpensively reprogrammed to implement other functions.

As described in U.S. Pat. No. 4,124,899, programmable array logic PAL circuits were developed to provide further improvements in the speed, space requirements, cost and power consumption of PLAs. In a most general sense, a PAL provides a field programmable logic array in which a programmable array of circuit inputs are provided to a plurality of AND gates to generate product terms. Outputs from subgroups of AND gates are, in turn, nonprogrammably connected as inputs to individual, specified OR gates to provide the sum of products. Hence, PALs provide programmable AND and fixed OR functions relative to generic PLAs.

There is an ongoing effort in the art to reduce the parts count, simplify the design and reduce the power consumption of PALs. Accordingly, PALs have been designed as zero power standby devices. That is, PALs do not generally consume power when the inputs are not being switched. This requires a latch on the output of all data paths to hold the output signal until it can be provided as an output.

Conventional PALs have heretofore provided a separate external latch for this purpose. Unfortunately, the provision of a latch on each output path consumes considerable silicon space and is therefore somewhat costly. Further, many of these latch circuits have been found to have a characteristic capacitance which, when driven, imposes a finite RC delay on the system performance. This tends to limit the speed of the data path.

Accordingly, there is a need in the art for a PAL circuit having an output which is fully latched without the use of an external latch.

SUMMARY OF THE INVENTION

The need in the art is addressed by the self-latching logic gate of the present invention. The self-latching logic gate of the present invention includes a first logic gate circuit for generating an output signal representative of a function of two or more input signals. The first logic gate circuit includes a first logic gate having at least two transistors, each transistor having first, second and third terminals. The first terminals of each transistor are connected to provide an output terminal for the self-latching logic gate and the first logic gate circuit. The second terminals of the transistors provide first and second data input terminals for the first logic gate circuit. The third terminals of each transistor are connected to a common termination (i.e. ground).

First and second complementary mode transistors are provided. Each includes first, second and third terminals, with the first terminal of the first transistor being connected to a source of electrical potential, the second terminals of the first and the second transistors being connected to each other to provide a common input terminal for the first and second transistors, the third terminal of the first transistor and the first terminal of the second transistor being connected to the output terminal of the first logic gate, and the third terminal of the second transistor being connected to ground.

A second logic gate circuit is provided for including a second logic gate having first and second inputs terminals, the first input terminal being connected to the output terminal of the first logic gate circuit, the second input terminal providing a latch input terminal for the self-latching gate, and the output terminal of the second logic gate being connected to the common input terminal of the first and second transistors.

In a specific embodiment, the present invention provides a NOR gate with a self-latching output, with minimal parts count and power consumption, which is suitable for use in a PAL system. In further more specific embodiments, the invention includes circuitry for verifying the state of the PAL array, circuitry for changing the polarity of the array output and circuitry for providing system security, all with minimal parts counts and power consumption.

BRIEF DESCRIPTION OF THE DRAWINGS

FIG. 3 is an illustrative implementation of a polarity switching circuit of a macrocell.

FIG. 4 is an illustrative schematic diagram of a transmission gate.

DESCRIPTION OF THE INVENTION

Figure 1:
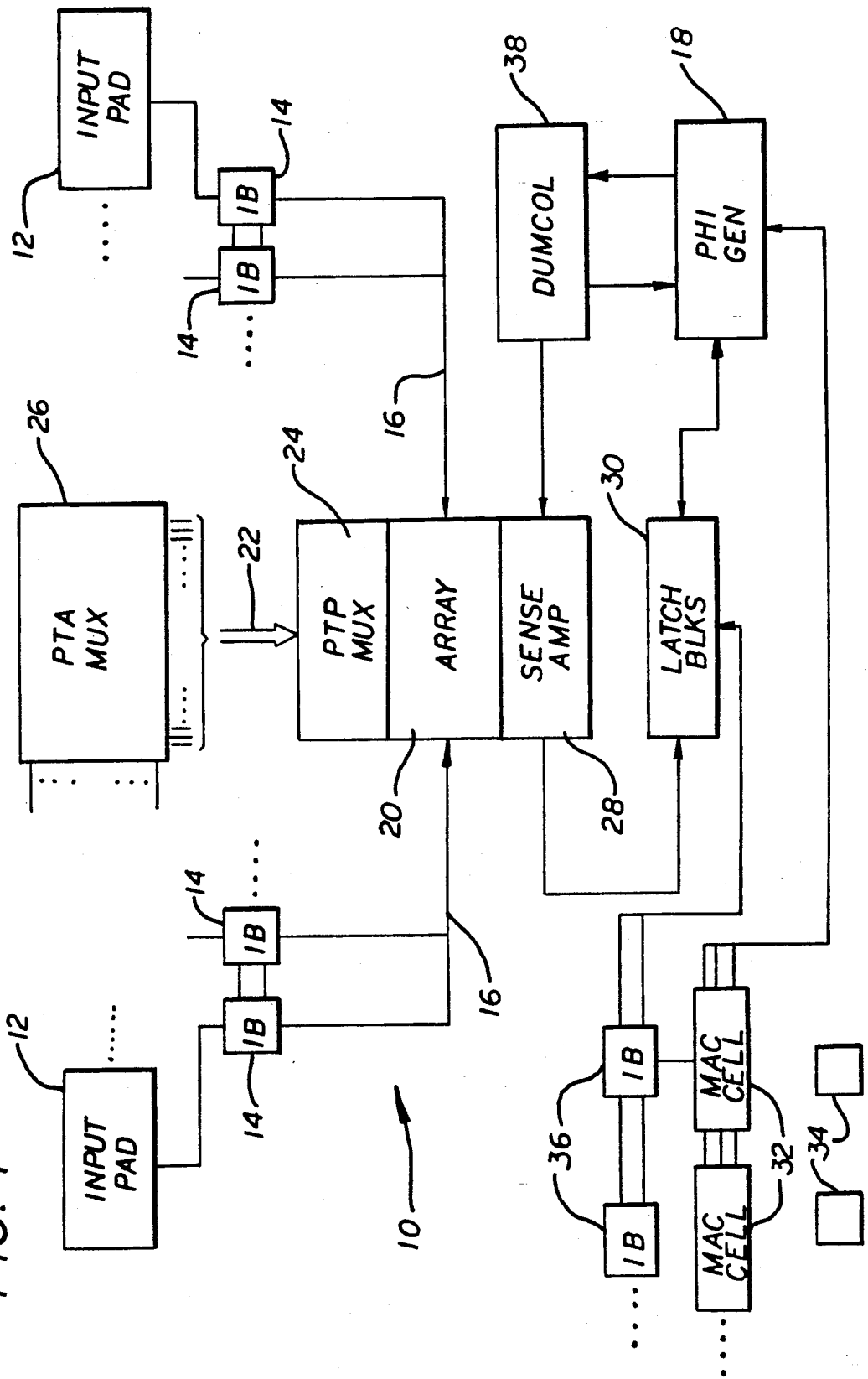
FIG. 1 is a simplified block diagram of an illustrative programmable array logic system.

FIG. 1 is a simplified block diagram of an illustrative programmable array logic (PAL) system 10. As is generally known in the art, the PAL 10 is a programmable logic array of a particularly advantageous design providing 'glue logic' for circuit interconnection at high speed with minimal power consumption. The PAL 10 includes a plurality of input pads 12 which are typically probe pads with electrostatic protection circuitry (not shown). The input pads 12 facilitate the bonding of a first circuit to another circuit via the 'glue logic' provided by the PAL 10. Each input pad 12 is connected to an input buffer (IB) 14. Each input buffer 14 includes circuitry for detecting address transitions at a corresponding input pad 12. Each input buffer 14 is connected to an input data bus 16 and a phi generator 18 via a transition detect signal (TDS) bus (not shown). The bus 16 communicates with an array 20. The array 20 typically provides an electrically erasable ($E^2$) cell array of AND gates (not shown). As is known in the art, each input of each AND gate of the array 20 may be programmably interconnected to a selected line of the input data bus 16. A set of sense amplifiers 28 are connected to the array 20. The sense amplifiers 28 are connected to a plurality of latching circuits or latch blocks 30, one for each output of the array 20. As discussed below, the latch blocks include the self-latching logic gate of the present invention. The latch blocks 30 are each connected to a macrocell 32, each of which, in turn, may be connected to one or more of a plurality of output pads 34. The output pads 34 may double as input pads when data is propagated in a reverse direction through the PAL 10 via the input buffers 36.

In a normal (nonprogramming) mode of operation, the PAL 10 is in a standby mode consuming little or no power. When the input to an input pad 12 is switched, the input data terms propagate through the associated input buffer 14 to the array 20. The address transition detection logic in the input buffer 14 detects the address change at the associated input pad 12 and triggers the phi generator 18. When triggered, the phi generator 18 generates a pulse to the sense amplifiers 28 and the latch blocks 30 and the sense amplifiers 28 and the latch blocks 30 turn on from an initial standby state in which little or no power is consumed. At the same time, the phi generator 18 sends 'BLTCH' and 'LTCH' signals to the latch blocks 30. Input data from a buffer 14 is used by the array 20 to change the states of the product terms. The sense amplifiers 28 detect a state change in the array 20 and drive the latch blocks 30 with product terms therefrom. The 'BLTCH' and 'LTCH' signals from the phi generator 18 enable the latch blocks 30 so that when data is available from the sense amplifiers 28 it is detected and latched by the latch blocks 30 and used to drive the macrocells 32. The macrocells 32 provide register and other output functions (e.g. enable control, D flip-flop, set and reset control and other information and state control) to the associated output pad.

As is known in the art, the timing of the latching function is critical to successful operation of the system 10. If the data is latched early, incorrect data may be output. If the data is latched late, incorrect data may be output or the device may operate at a slower than optimal speed. Accordingly, a dummy column 38 is provided which is essentially a capacitive load. The dummy column 38 is a delay circuit which models the propagation of data through the array 20 to the latch blocks 30. The dummy column 38 therefore provides proper timing for the phi generator 18.

Figure 2:
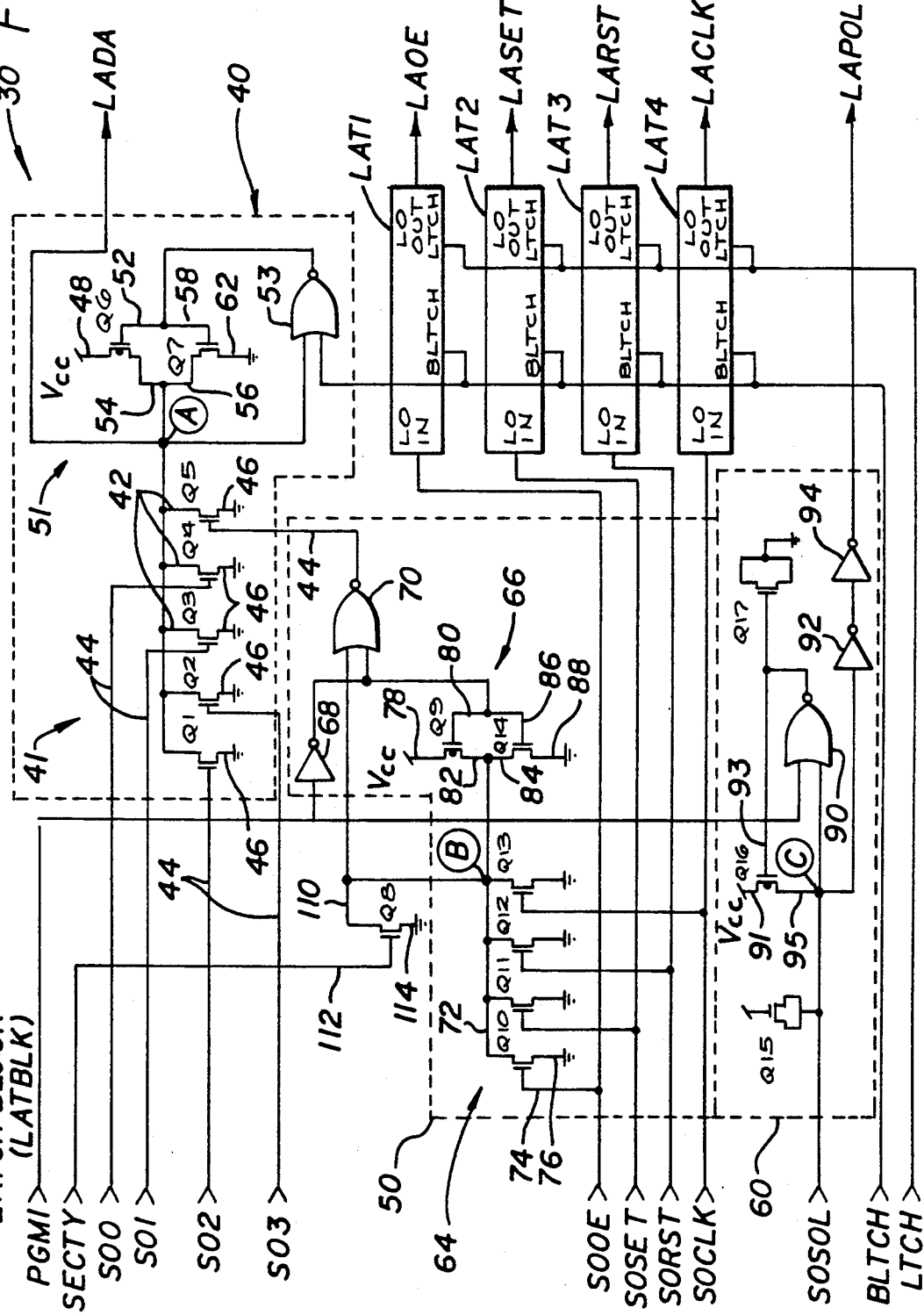
FIG. 2 is a schematic diagram of an illustrative embodiment of the self-latching logic gate of the present invention.

As mentioned above, the latch blocks 30 include latching circuits which, inter alia, provide the logic function (e.g. the OR function) of the product terms and latch the result for output to the associated macrocell 32. Conventional latch blocks have heretofore used a logic gate (e.g. an OR gate) with a separate external latch. As mentioned above, the use of a separate latch adds to the circuit complexity, cost and power consumption and may reduce the speed of the system. One advantageous aspect of the present invention is the provision of a self-latching logic gate which provides the desired logic (OR) function and latches the result for output without the use of a separate latch external thereto. A schematic diagram of an illustrative embodiment of a latch block 30 incorporating the self-latching logic gate of the present invention is shown in FIG. 2. The latch block 30 includes an illustrative implementation of the self-latching logic gate 40 of the present invention, a verification circuit 50, a polarity circuit 60, a plurality of conventional latches LAT1-LAT4, and a transistor Q8.

The self-latching logic gate 40 includes a plurality of transistors Q1-Q5 which provide a first logic gate 41 (NOR gate). Each transistor is implemented as an n-channel MOS device having first, second and third terminals 42, 44, and 46 respectively. The first terminals 42 of each transistor are connected at a common node 'A' to provide an output terminal of the latch block 30 and the logic gate 40. The second terminals 44 of the transistors provide input terminals for the logic gate 40. The first four transistors Q1-Q4 receive data input from the sense amplifiers 28 on lines SO0 to SO3 respectively. The fifth input to the NOR gate 41 is provided to the second terminal 44 of the fifth transistor Q5 by the output of the verification circuit 50. The third terminals 46 of each transistor are connected to a common ground termination.

The self-latching logic gate 40 includes a circuit 51 which provides a latching function. The circuit 51 is comprised of first and second complementary mode transistors Q6 and Q7 and a second logic gate, a NOR gate, 53. The first terminal 48 of the first transistor Q6 of the circuit 51 is connected to a source of electrical potential $V_{cc}$. The second terminal, the input terminal, 52 is connected to the output of the NOR gate 53 and the third terminal 54 is connected to the output terminal of the first NOR gate 41 at node 'A'. Hence, power is supplied to the transistors Q1-Q5 from $V_{cc}$ through the first transistor Q6 whenever it is activated by a low output from the second logic gate 53. The first terminal 56 of the second transistor Q7 is also connected to the output of the first logic gate 41 at node 'A'. The second (input) terminal 58 of the second transistor Q7 of the circuit 51 is also connected to the output of the second logic gate 53. The third terminal 62 of the second transistor Q7 is connected to ground. The first and second transistors Q6 and Q7 are complementary mode transistors in that the first transistor Q6 is a p-channel transistor and the second transistor Q7 is an n-channel transistor.

The circuit 30 may be fabricated as a chip of silicon or other suitable material on a suitable substrate. Table I below provides illustrative widths and lengths, in microns, of each of the circuit elements for a preferred embodiment of the invention.

TABLE I

| ELEMENT | WIDTH | LENGTH |
|---------|-------|--------|
| Q1 | 25 | 1.8 |
| Q2 | 25 | 1.8 |
| Q3 | 25 | 1.8 |
| Q4 | 25 | 1.8 |
| Q5 | 25 | 1.8 |
| Q6 | 7 | 2 |
| Q7 | 10 | 1.8 |
| Q8 | 10 | 1.8 |

TABLE I-continued

| ELEMENT | WIDTH | LENGTH |
|---|---|---|
| Q9 | 6 | 15 |
| Q10 | 10 | 1.8 |
| Q11 | 10 | 1.8 |
| Q12 | 10 | 1.8 |
| Q13 | 10 | 1.8 |
| Q14 | 6 | 1.8 |
| Q15 | 15 | 15 |
| Q16 | 6 | 15 |
| Q17 | 14 | 2 15 |
| INV1 | 6 | 6 |
| INV2 | 6 | 6 |
| INV3 | 10 | 10 |
| NOR1 | 6 | 6 |
| NOR2 | 10 | 6 |
| NOR3 | 6 | 6 |

In operation, when the addresses are not switching at any of the input pads 12, the output of the second NOR gate 53 is high. Thus, Q6 is off and no power is consumed by the self-latching logic gate 40.

When an input is switched at an input pad 12, for example, the associated input buffer 14 triggers the phi generator 18 which, in turn, generates latch signals 'LTCH' and 'BLTCH' for each latch block 30. When the BLTCH signal goes high, the output of the second NOR gate 53 goes low, Q6 turns on and the first NOR gate 41 is enabled.

As mentioned above, the phi generator operates under control of the dummy column 38 to provide proper timing for the generation of the latch signals 'LTCH' and 'BLTCH' relative to the propagation delay of data through the array 20 and sense amplifiers 28. Accordingly, data is received by the first NOR gate 41 at an input 44, at the same time the latch signal BLTCH is received by the second NOR gate 53. Thus, if any of the inputs are high, the output of the self-latching logic gate 40 at node A will be low. If none of the inputs are high, the output of the self-latching logic gate 40 will be high.

In the steady state, the inputs at pad 12 stop switching and the signal BLTCH goes low. As node A provides a second input to the second NOR gate 53, when the output of the logic gate 40 is high, the output of the second NOR gate 53 is low. This keeps Q6 on and node A at a high level. In the steady state, when the output of the logic gate 40 is low, both inputs to the second NOR gate 53 are low and the output of the gate is high. This high state keeps Q6 off, Q7 on and node A tied to ground. The output of the self-latching logic gate 40 will remain low. The outputs of the sense amplifiers 28 are low so no current is flowing from $V_{cc}$ to ground. This is the generally desired result when the inputs are not switching, i.e., no power consumption and data latched. In any case, the output is provided on line 'LADA' for convenient access by an associated macrocell 32.

The verification circuit 50 of the self-latching logic gate 30 includes a four input logic gate 64, a second set of complementary mode transistors 66, an inverter 68 and a two input NOR gate 70. The four input NOR gate 64 includes four n-channel transistors Q10–Q13 arranged in essentially the same configuration as the transistors Q1–Q5 of the first logic gate 41. That is, each transistor includes first, second and third terminals 72, 74, and 76 respectively. The first terminals 72 of each transistor are connected at a common node 'B' to provide an output terminal of the gate 64. The second terminals 74 of the transistors provide input terminals for the gate 64. The transistors Q10–Q13 receive input from the sense amplifiers 28 on lines 'SOOE', 'SOSET', 'SORST' and 'SOCLK' respectively. These signals are also provided to four conventional latches LAT1, LAT2, LAT3, and LAT4. The third terminals 76 of each transistor are connected to ground.

The four input NOR gate 64 is enabled via the complementary mode transistors Q9 and Q14, one of which Q9 is p-channel and the other of which Q14 is n-channel. The p-channel transistor Q9 includes three terminals 78, 80 and 82. The first terminal 78 is connected to a source of electrical potential $V_{cc}$. The second terminal 80 is connected to the output of the inverter 68 and the third terminal 82 is connected to node B. The n-channel transistor Q14 includes first, second and third terminals 84, 86 and 88 respectively. The first terminal 84 is connected to node B, the second terminal 86 is connected to the second terminal 80 of the p-channel transistor Q9, and the third terminal 88 is connected to ground. The two inputs to the two input NOR gate 70 are provided by the output of the four input NOR gate 64 and the inverter 68. The output of the two input NOR gate 70 is provided as the fifth input to the self-latching logic gate 40 via the fifth transistor Q5.

When the system 10 is in the programming mode, the sense amplifiers 28 are on and the latches are switched on (into a passthrough mode) as the latches are no longer required. Unfortunately, in the programming mode, the program in the array 20 can not be verified directly because the product terms are used to drive the clock, set, reset and output controls, for example, of the macrocells 32. There is therefore a need for a circuit which would permit the verification of the program stored in the array 20. The verification circuit 50 fills this need by providing an indication as to whether or not the array 20 has been programmed. The four input NOR gate 64 feeds the product terms on lines 'SOOE', 'SOSET', 'SORST' and 'SOCLK' to the first NOR gate 41 via the fifth transistor Q5. Circuit 50 is used to verify 'SOOE', 'SOSET', 'SORST' and 'SOCLK'. Circuit 40 is also used as a verification circuit for SO0 to SO3.

In operation, in the normal (speed) mode, line 'PGM1' is low and the output of the inverter 68 is high. As a result, the output of the NOR gate 70 is low and the fifth transistor Q5 of the first NOR gate 41 is off. Also, the p-channel transistor Q9 of the verification circuit 50 is off. The n-channel transistor Q14 is on and it ties down the node B and pulls the NOR gate 64 low.

In the program mode, when the signal on line PGM1 goes high, the output of the inverter 68 goes low and turns off the n-channel transistor Q14 while turning on the p-channel transistor Q9. This enables the four input NOR gate 64. Thus, the fifth transistor Q5 of the first NOR gate 41 is turned on or off depending on the state of the product terms on lines SOOE, SOSET, SORST and SOCLK via the two input NOR gate 70. That is, if there is a product term programmed at a particular address, the output on line LADA will be high, if not, the output will be low. Each product term is verified individually. For example, if one is verifying SOOE, all other product terms are pulled low by the decoders. This allows for the verification of the cells of the array 20 for particular product terms with minimal additional circuitry.

The polarity circuit 60 includes a p-channel transistor Q16, a NOR gate 90, a buffer provided by two inverters 92 and 94, a pull-up capacitor Q15 and a pull down capacitor Q17. The polarity circuit 60 provides an invert or noninvert control latch for the switching circuit 100 of the macrocell as discussed below. It allows for the programmability of the polarity of the output of the system 10. The p-channel transistor Q16 includes first, second and third terminals 91, 93 and 95. The first terminal 91 is connected to a source of electrical potential $V_{cc}$, the second terminal 93 is connected to ground via the pull down capacitor Q17, and the third terminal is connected to the polarity input line 'SOPOL'. The inputs to the NOR gate 90 of the polarity circuit 60 are provided by the output of the p-channel transistor Q16 and the program line PGM1. The output of the NOR gate 90 is tied to the input terminal 93 of the p-channel transistor Q16. The output of the polarity circuit 60 appears at node 'C'.

In the normal mode of operation, the program signal on line PGM1 is low and the state of the polarity circuit 60 depends on the polarity of the input on line SOPOL. If the cell in the array 20 providing the polarity signal SOPOL is programmed, the signal SOPOL will be low and the output of the NOR gate 90 will be high. This will turn off the p-channel transistor Q16 and node C will remain low until the polarity signal SOPOL goes high or the system 10 is switched into the program mode (PGM1 goes high). When the polarity signal on line SOPOL is high, the output of the NOR gate 90 will be low, the p-channel transistor Q16 will be on and node C will be held high. Thus, it will be seen that the polarity circuit 60 acts as a latch. The output from node C is buffered by inverters 92 and 94 before being input to a switching circuit 100 in a macrocell 32 such as that shown in FIG. 3. As shown in FIG. 3, the switching circuit 100 includes two transmission gates or switches 102 and 104 and an inverter 106. (See the illustrative transmission gate of FIG. 4.) An input data term D is fed into the first transmission gate 102 and the inverter 106. The transmission gates are controlled by the LAPOL signal. That is, the LAPOL signal is fed into the clock bar input of the first transmission gate 102 and into the clock input of the second transmission gate 104. Thus, when LAPOL is low, the first transmission gate 102 is on, the output of the switch 100 is D and likewise, when LAPOL is high, the first transmission gate 102 is off, the second gate 104 is on and the output of the switching circuit 100 is the complement of D. The output of the switching circuit 100 is fed to the macrocell logic in a conventional manner.

Returning again to FIG. 2, an n-channel transistor Q8 is shown having a first terminal 110 connected to an input of a NOR gate 70 of the verification circuit 50 and the output of the first NOR gate 64 of the verification circuit at node B. The second terminal 112 of the transistor Q8 is connected to a line 'SECTY' from programming circuitry of the system 10 (not shown). The third terminal 114 is connected to ground.

The transistor Q8 provides a security feature in that when the security cell in the array 20 is programmed, transistor Q8 inhibits the operation of the verification circuit 50 and thereby prevents the verification of the array 20. That is, when the line SECTY is high, Q8 turns on and the input to the NOR gate 70 is low. In the program mode and in the verification mode, the signal on line PGM1 is high. The output of the inverter 68 is low so the NOR gate 70 has two low inputs. Hence the output of the NOR gate 70 is high, Q5 is on and the output of the self-latching gate 40 is high regardless of the status of the product terms. Those skilled in the art will recognize that unauthorized access to the program in the array 20 is effectively prohibited by the arrangement of FIG. 2.

Thus, it will be seen by those skilled in the art that the self-latching logic gate 40 of the present invention provides a latch with minimal additional circuitry and minimum power consumption, without a separate external latch. While the invention has been described herein with reference to an illustrative embodiment for a particular application, it will be understood that the invention is not limited thereto. Those of ordinary skill in the art will recognize additional modifications, applications and embodiments within the scope thereof. For example, the invention is not limited to implementation in either positive or negative logic. Nor is the invention limited to the use of field effect transistors. Any suitable switching element may be used in place of the transistors in the illustrative embodiments without departing from the scope of the present teachings. Further, the invention is not limited to the NOR gate implementation illustrated herein. For example, an OR gate implementation is clearly anticipated by the present teachings. Nor is the invention limited to the number of inputs on the logic gate. Gates of any size suitable for a particular application may be realized utilizing the principles of the present invention.

Thus, it is intended by the appended claims to cover any and all such applications, modifications and embodiments.

Accordingly,

What is claimed is:

1. A self-latching logic gate comprising:

first logic gate means for generating an output signal representative of a function of two or more input signals including a NOR gate having at least two transistors with each transistor having a first, a second and a third terminal, said first terminal of each transistor being connected to provide an output terminal of said first logic gate means and said self-latching logic gate, said second terminals of said transistors providing a first and a second data input terminal for said first logic gate means, and said third terminal of each transistor being connected to a common termination;

a first and second complementary mode transistor, each transistor having a first, a second and a third terminal, said first terminal of said first complementary mode transistor being connected to a source of electrical potential, said second terminals of said first and said second complementary mode transistors being connected to each other to provide a common input terminal for said first and second complementary mode transistors, said third terminal of said first complementary mode transistor being connected to said output terminal of said NOR gate, said first terminal of said second complementary mode transistor being connected to said output terminal of said NOR gate, and said third terminal of said second complementary mode transistor being connected to said common termination; and second logic gate means for generating an output signal representative of a function of two or more input signals, said second logic gate means including a second logic gate having a first and a second input terminal, said first input terminal being connected to said output terminal of said first logic gate means, said second input terminal providing a latch input terminal for said self-latching logic gate, and the output terminal of said second logic gate being connected to the common input terminal of said first and second complementary mode transistors.

2. The self-latching gate of claim 1 wherein said second logic gate is a NOR gate.

3. The self-latching gate of claim 2 wherein said transistors in said first logic gate means are n-channel transistors.

4. A programmable logic array comprising:
array logic means for providing a plurality of product terms on a plurality of selected lines on receipt of an input signal;
latch means for providing a logic function of said product terms and for latching the result of said logic function, said latch means including a self-latching logic gate comprising:
first logic gate means for generating an output signal representative of a function of two or more input signals including a first logic gate having at least two transistors with each transistor having a first, a second and a third terminal, said first terminal of each transistor being connected to provide an output terminal of said first logic gate means and said self-latching logic gate, said second terminals of said transistors providing a first and a second data input terminal for said first logic gate means, and said third terminal of each transistor being connected to a common termination;
a first and a second complementary mode transistor, each transistor having a first, a second and a third terminal, said first terminal of said first complementary mode transistor being connected to a source of electrical potential, said second terminals of said first and said second complementary mode transistors being connected to each other to provide a common input terminal for said first and second complementary mode transistors, said third terminal of said first complementary mode transistor being connected to said output terminal of said first logic gate, said first terminal of said second complementary mode transistor being connected to said output terminal of said first logic gate, and said third terminal of said second complementary mode transistor being connected to said common termination;
second logic gate means for generating an output signal representative of a function of two or more input signals, said second logic gate means including a second logic gate having a first and a second input terminal, said first input terminal being connected to said output terminal of said first logic gate means, said second input terminal providing a latch input terminal for said self-latching logic gate, and the output terminal of said second logic gate being connected to the common input terminal of said first and second complementary mode transistors; and
verification circuit means for use with said programmable logic array for verifying the state thereof.

5. The programmable logic array of claim 4 wherein said verification circuit comprises:
third logic gate means for generating an output signal representative of a function of two or more input signals, said input signals being provided by the product terms on said selected lines, said third logic gate means including a third logic gate having at least two transistors with each transistor having a first, a second and a third terminal, said first terminal of each transistor being connected to provide an output terminal of said third logic gate means, said second terminals of said transistors providing a first and a second data input terminal for said third logic gate means, and said third terminal of each transistor being connected to a common termination;
a third and a fourth complementary mode transistor, each transistor having a first, a second and a third terminal, said first terminal of said third complementary mode transistor being connected to a source of electrical potential, said second terminals of said third and said fourth complementary mode transistors being connected to each other to provide a common input terminal for said third and fourth complementary mode transistors, said third terminal of said third complementary mode transistor being connected to said output terminal of said third logic gate, said first terminal of said fourth complementary mode transistor being connected to said output terminal of said third logic gate, and said third terminal of said fourth complementary mode transistor being connected to said common termination; and
fourth logic gate means for generating an output signal representative of a function of two or more input signals, and fourth logic gate means including a fourth logic gate having a first and a second input terminal, said first input terminal being connected to said output terminal of said third logic gate means, said second input terminal being connected to the common input terminal of said third and fourth complementary mode transistors and an output terminal of a fifth logic gate, said fourth logic gate means further including means for connecting said output terminal of said first logic gate means of said self-latching logic gate.

6. The programmable logic array of claim 5 including security circuit means for inhibiting said verification circuit.

7. The programmable logic array of claim 6 wherein said security circuit means includes a transistor having a first, second and a third terminals, said first terminal being connected to the output of said third logic gate of said verification circuit, said second terminal being connected to an output of said array logic means, and said third terminal being connected to said common termination.

8. A programmable logic array comprising:
array logic means for providing a plurality of product terms on a plurality of selected lines on receipt of an input signal;
latch means for providing a logic function of said product terms and for latching the result of said logic function, said latch means including a self-latching logic gate comprising:
first logic gate means for generating an output signal representative of a function of two or more input signals including a first logic gate having at least two transistors with each transistor having a first, a second and a third terminal, said first terminal of each transistor being connected to provide an output terminal of said first logic gate means and said self-latching logic gate, said second terminals of said transistors providing a first and a second data input terminal for said first logic gate means, and said third terminal of each transistor being connected to a common termination;

a first and a second complementary mode transistor; each transistor having a first, a second and a third terminal, said first terminal of said first complementary mode transistor being connected to a source of electrical potential, said second terminals of said first and said second complementary mode transistors being connected to each other to provide a common input terminal for said first and second complementary mode transistors, said third terminal of said first complementary mode transistor being connected to said output terminal of said first logic gate, said first terminal of said second complementary mode transistor being connected to said output terminal of said first logic gate, and said third terminal of said second complementary mode transistor being connected to said common termination;

second logic gate means for generating an output signal representative of a function of two or more input signals, said second logic gate means including a second logic gate having a first and a second input terminal, said first input terminal being connected to said output terminal of said first logic gate means, said second input terminal providing a latch input terminal for said self-latching logic gate, and the output terminal of said second logic gate being connected to the common input terminal of said first and second complementary mode transistors; and polarity circuit means for signaling a change in the polarity of the signals output from said latch means.

9. The programmable logic array of claim 8 wherein said polarity circuit means includes a transistor and a NOR gate, said transistor including a first, a second and a third terminal, said first terminal being connected to a source of electrical potential, said second terminal being an input terminal thereof and being connected to an output of said NOR gate and said third terminal being connected to a first input of said NOR gate, a second input of said NOR gate being connected to a first output of said array logic means and said first input of said NOR gate being connected to a second output of said array logic means, the output of said polarity circuit being provided by the third terminal of said transistor.

10. A self-latching gate comprising:

first logic gate means for generating an output signal representative of a function of two or more input signals including a first logic gate having at least two transistors with each transistor having a first, a second and a third terminal, said first terminal of each transistor being connected to provide an output terminal of said first logic gate means and said self-latching logic gate, said second terminals of said transistors providing a first and a second data input terminal for said first logic gate means, and said third terminal of each transistor being connected to a common termination;

a first and second complementary mode transistor, each transistor having a first, a second and a third terminal, said first terminal of said first complementary mode transistor being connected to a source of electrical potential, said second terminals of said first and said second complementary mode transistors being connected to each other to provide a common input terminal for said first and second complementary mode transistors, said third terminal of said first complementary mode transistor being connected to said output terminal of said first logic gate, said first terminal of said second complementary mode transistor being connected to said output terminal of said first logic gate, and said third terminal of said second complementary mode transistor being connected to said common termination; and second logic gate means for generating an output signal representative of a function of two or more input signals, said second logic gate means being a NOR gate having a first and a second input terminal, said first input terminal being connected to said output terminal of said first logic gate means, said second input terminal providing a latch input terminal for said self-latching logic gate, and the output terminal of said NOR gate being connected to the common input terminal of said first and second complementary mode transistors.

11. A self-latching logic gate comprising:

first and second complementary mode transistors, each transistor having a first, a second and a third terminal, said first terminal of said first complementary mode transistor being connected to a source of electrical potential, said second terminals of said first and said second complementary mode transistors being connected to each other to provide a common input terminal for said first and second complementary mode transistors, said third terminal of said first complementary mode transistor being the input terminal of said self-latching logic gate and being connected to the first terminal of said second complementary mode transistor, said third terminal of said second complementary mode transistor being connected to ground and logic gate means for generating an output signal representative of a function of two or more input signals, said logic gate means being a NOR gate having a first and a second input terminal, said first input terminal being connected to said input terminal of said self-latching logic gate, said second input terminal of said NOR gate providing a latch input terminal for said self-latching logic gate, and an output terminal of said NOR gate being connected to the common input terminal of said first and second complementary mode transistors.

* * * * *